(12) United States Patent
Kawamoto et al.

(10) Patent No.: US 7,816,313 B2
(45) Date of Patent: Oct. 19, 2010

(54) PHOTORESIST RESIDUE REMOVER COMPOSITION AND SEMICONDUCTOR CIRCUIT ELEMENT PRODUCTION PROCESS EMPLOYING THE SAME

(75) Inventors: Hiroshi Kawamoto, Kamakura (JP); Mikie Miyasato, Yokohama (JP); Takuo Oowada, Soka (JP); Norio Ishikawa, Kasukabe (JP)

(73) Assignees: Kanto Kagaku Kabushiki Kaisha, Tokyo (JP); Kabushiki Kaisha Toshiba, Tokyo (JP)

( * ) Notice: Subject to any disclaimer, the term of this patent is extended or adjusted under 35 U.S.C. 154(b) by 367 days.

(21) Appl. No.: 12/082,173

(22) Filed: Apr. 8, 2008

(65) Prior Publication Data

US 2008/0318424 A1 Dec. 25, 2008

Related U.S. Application Data

(63) Continuation of application No. 11/008,019, filed on Dec. 9, 2004, now abandoned.

(30) Foreign Application Priority Data

Dec. 9, 2003 (JP) .............................. 2003-410836

(51) Int. Cl.
H01L 21/02 (2006.01)
(52) U.S. Cl. .................. 510/175; 510/176; 134/1.3; 252/79.1; 252/79.4
(58) Field of Classification Search .............. 510/175, 510/176; 134/1.3; 252/79.1, 79.4
See application file for complete search history.

(56) References Cited

U.S. PATENT DOCUMENTS

| | | | | |
|---|---|---|---|---|
| 6,518,142 B2 * | 2/2003 | Yamamoto | .................. | 438/396 |
| 6,605,230 B1 * | 8/2003 | Liaw et al. | .................. | 216/104 |
| 6,777,380 B2 * | 8/2004 | Small et al. | .................. | 510/176 |
| 7,456,140 B2 * | 11/2008 | Small et al. | .................. | 510/175 |
| 2002/0037820 A1 * | 3/2002 | Small et al. | .................. | 510/175 |
| 2002/0072235 A1 * | 6/2002 | Haga et al. | .................. | 438/689 |
| 2002/0086552 A1 | 7/2002 | Saito et al. | .................. | 438/745 |
| 2002/0137357 A1 * | 9/2002 | Chen et al. | .................. | 438/745 |
| 2003/0211678 A1 * | 11/2003 | Chen et al. | .................. | 438/200 |
| 2004/0016719 A1 * | 1/2004 | Liaw et al. | .................. | 216/37 |
| 2005/0089489 A1 * | 4/2005 | Carter | .................. | 424/70.1 |
| 2005/0202987 A1 * | 9/2005 | Small et al. | .................. | 510/175 |
| 2005/0209118 A1 * | 9/2005 | Kawamoto et al. | .................. | 510/175 |
| 2005/0287480 A1 * | 12/2005 | Takashima | .................. | 430/331 |
| 2008/0171682 A1 * | 7/2008 | Kane et al. | .................. | 510/176 |
| 2008/0318424 A1 * | 12/2008 | Kawamoto et al. | .................. | 438/687 |
| 2009/0246967 A1 * | 10/2009 | Yaguchi et al. | .................. | 438/745 |

* cited by examiner

Primary Examiner—Gregory E Webb
(74) Attorney, Agent, or Firm—L.C. Begin & Associates, PLLC.

(57) ABSTRACT

A photoresist residue remover composition is provided that removes a photoresist residue formed by a resist ashing treatment after dry etching in a step of forming, on a substrate surface, wiring of any metal of aluminum, copper, tungsten, and an alloy having any of these metals as a main component, the composition including one or two or more types of inorganic acid and one or two or more types of inorganic fluorine compound. There is also provided a process for producing a semiconductor circuit element wherein, in a step of forming wiring of any metal of aluminum, copper, tungsten, and an alloy having any of these metals as a main component, the photoresist residue remover composition is used for removing a photoresist residue formed by a resist ashing treatment after dry etching.

20 Claims, 4 Drawing Sheets

PHOTORESIST RESIDUE REMOVER COMPOSITION AND SEMICONDUCTOR CIRCUIT ELEMENT PRODUCTION PROCESS EMPLOYING THE SAME

CROSS-REFERENCE TO RELATED APPLICATIONS

This application is a Continuation application of U.S. Utility application Ser. No. 11/008,019 filed on Dec. 9, 2004 now abandoned.

BACKGROUND OF THE INVENTION

The present invention relates to a photoresist residue remover composition and, in particular, to a photoresist residue remover composition for removing a photoresist residue formed by a resist ashing treatment after dry etching in a step of forming, on a substrate surface, wiring of any metal of aluminum, copper, tungsten, and an alloy having any of these metals as a main component in the production of a semiconductor circuit element, and a semiconductor circuit element production process employing the photoresist residue remover composition. More particularly, it relates to a photoresist residue remover composition containing an inorganic acid, an inorganic fluorine compound, and water and containing no hydrogen peroxide, and a semiconductor circuit element production process employing the photoresist residue remover composition.

The photoresist residue referred to here means a photoresist residue (also called sidewall polymer, sidewall protection film, rabbit ear) comprising incompletely ashed resist, an organometallic polymer, a metal oxide, etc., which remains on the substrate surface after dry etching and then ashing the resist.

DESCRIPTION OF THE RELATED ART

In the production process of a semiconductor circuit element, a photoresist residue formed in a step of forming a metal wiring pattern of aluminum, copper, tungsten, or an alloy having any of these metals as a main component on a substrate surface, the step employing a photoresist together with dry etching and ashing, is usually removed by a photoresist residue remover.

With regard to a photoresist residue remover used when forming metal wiring on a substrate surface, for example, in a case when the wiring is an aluminum alloy, a photoresist residue remover composition containing ammonium fluoride, an organic acid, and water has been reported (e.g., JP, A, 6-349785), but the content of acetic acid, which corresponds to the organic acid, is a high value of 30 to 90 wt %, and a heavy burden is thus imposed on the environment; moreover, acetic acid has unpleasant smell, and the workability is poor.

Furthermore, in the case when the wiring is any of aluminum, an aluminum alloy, and tungsten, a photoresist residue remover composition comprising 'fluorine compound+quaternary ammonium compound+water' or 'fluorine compound+quaternary ammonium compound+organic solvent+water', and a resist and etching residue remover composition comprising 'hydroxylamine+alkanolamine (+solvent)' have been proposed (e.g., JP, A, 7-201794 and U.S. Pat. No. 5,334,332). Although these photoresist residue removers are less corrosive to the metal and can be used at room temperature, it takes a long treatment time of 20 to 30 minutes to completely remove the adhered photoresist residue. Because of this, these photoresist residue removers cannot be used in a single wafer cleaning system requiring a short, low temperature treatment, which has recently been introduced to the photoresist residue removal step. Furthermore, these photoresist residue removers contain a few tens or more wt % of an organic compound such as a quaternary amine or an organic solvent, thus imposing a heavy burden on the environment.

In contrast, it has been reported that a composition comprising 'fluoride-containing compound+sulfuric acid+hydrogen peroxide or ozone+water', which are all inorganic compounds, can remove a photoresist residue with a short, low temperature treatment, and is less corrosive to an aluminum alloy (e.g., JP, A, 11-243085), but since the hydrogen peroxide or ozone decomposes, the stability over time of the photoresist residue remover itself is a problem. Furthermore, when used in a single wafer cleaning system, as shown in Examples of the present invention, corrosion of a wiring metal such as aluminum cannot be suppressed sufficiently. As a fluoride-containing compound, only hydrofluoric acid is cited as an example.

On the other hand, as a photoresist residue remover for removing a photoresist residue formed during dry etching when forming a substrate having no wiring, compositions comprising 'sulfuric acid 5 to 7+hydrofluoric acid 1/400 to 1/1000 (ratio by volume)' or 'sulfuric acid 5 to 7+aqueous hydrogen peroxide 1+hydrofluoric acid 1/400 to 1/1000 (ratio by volume)' have been reported (e.g., JP, A, 11-135473). As the amount of hydrofluoric acid added and the amount of hydrogen peroxide added is too small, the concentration of sulfuric acid is not diluted, and no consideration was given to the influence on a metal, etc. used for wiring.

Furthermore, although it is not a photoresist residue remover, a composition comprising '0.01 to 1.0 wt % of hydrofluoric acid+0.001 to 30.0 wt % of an inorganic acid (hydrochloric acid, sulfuric acid, nitric acid)+water', etc. has been reported as an etching composition for a doped silicon oxide film (e.g., JP, A, 2003-45894). These compositions might be able to remove a photoresist residue containing an inorganic oxide, but the possibility of the use thereof for removal of a photoresist residue has not yet been reported. It can perhaps be expected that, since a composition comprising 'hydrofluoric acid+about 10% or greater of nitric acid+water' (e.g., JP, A, 5-82505), a composition comprising 'hydrofluoric acid 10+nitric acid 250+water 60 (ratio by volume)' (e.g., JP, A, 6-10161), etc. have been reported as etching compositions for an aluminum alloy, the above-mentioned compositions are judged to be highly corrosive to wiring.

As hereinbefore described, in a step involving forming, on a substrate surface, wiring of any metal of aluminum, copper, tungsten, and an alloy having any of these metals as a main component in a production step for a semiconductor circuit element, no photoresist residue remover, as a photoresist residue remover composition for removing a photoresist residue formed by a resist ashing treatment after dry etching, has so far been disclosed that is not corrosive to the metal wiring, does not contain a large amount of an organic compound such as an organic solvent in order to lessen the burden on the environment, and has excellent storage stability, and there has been a desire for development of a photoresist residue remover composition that enables a short, low temperature treatment to be carried out and can therefore be employed in the single wafer cleaning system, which has been used in recent years.

SUMMARY OF THE INVENTION

It is therefore an object of the present invention to provide a photoresist residue remover composition that removes a photoresist residue formed by a resist ashing treatment after dry etching in a step involving forming, on a substrate surface, wiring formed from any metal of aluminum, copper, tungsten, and an alloy having any of these metals as a main component in a production step for a semiconductor circuit element, the photoresist residue remover composition having low corrosiveness to the wiring material, not containing a large amount of an organic compound such as an organic solvent so as to lessen the burden on the environment, having excellent storage stability, and enabling a short, low temperature treatment to be carried out.

As a result of an intensive investigation by the present inventors in order to solve the above-mentioned problems, it has been found that a photoresist residue remover composition containing an inorganic acid and an inorganic fluorine compound has sufficiently suppressed corrosiveness to aluminum, copper, tungsten, and an alloy having any of these metals as a main component, can remove a photoresist residue with a short, low temperature treatment, and has excellent storage stability, and the present invention has thus been accomplished.

That is, the present invention relates to a photoresist residue remover composition for removing a photoresist residue formed by a resist ashing treatment after dry etching in a step of forming, on a substrate surface, wiring of any metal of aluminum, copper, tungsten, and an alloy having any of these metals as a main component, the composition comprising one or two or more types of inorganic acid and one or two or more types of inorganic fluorine compound.

Furthermore, the present invention relates to the photoresist residue remover composition wherein the amount of inorganic acid added is 30% by mass or less, and the amount of inorganic fluorine compound added is 0.001 to 0.015% by mass.

Moreover, the present invention relates the photoresist residue remover composition wherein it contains no hydrogen peroxide.

Furthermore, the present invention relates to the photoresist residue remover composition wherein the inorganic acid is sulfuric acid, and the inorganic fluorine compound is hydrofluoric acid.

Moreover, the present invention relates to a process for producing a semiconductor circuit element wherein, in a step of forming wiring of any metal of aluminum, copper, tungsten, and an alloy having any of these metals as a main component, the photoresist residue remover composition is used to remove a photoresist residue formed by a resist ashing treatment after dry etching.

Furthermore, the present invention relates to a process for producing a semiconductor circuit element, wherein the photoresist residue remover composition is used for carrying out a pre-treatment or a post-treatment on multilayer wiring.

The photoresist residue remover composition of the present invention enables the photoresist residue to be removed by a short, low temperature treatment, and the ratio of the inorganic acid to the inorganic fluorine compound added is optimized so that corrosion of aluminum, copper, tungsten, and an alloy having any of these metals as a main component can be suppressed sufficiently. Furthermore, since the composition of the present invention contains only inorganic compounds, the burden on the environment can be lessened, and the combination of an inorganic acid and an inorganic fluorine compound exhibits the effect of minimizing the influence on metal wiring while enhancing resist residue removability by the short, low temperature treatment, which cannot be achieved by conventional technology.

As hereinbefore described, the photoresist residue remover composition of the present invention is a photoresist residue remover composition for removing a photoresist residue formed by a resist ashing treatment after dry etching in a step of forming, on a substrate surface, wiring of any metal of aluminum, copper, tungsten, and an alloy having any of these metals as a main component, the composition enabling the photoresist residue to be removed by a short, low temperature treatment and sufficiently suppressing corrosion of the metals.

BEST MODE FOR CARRYING OUT THE INVENTION

Figure 1:
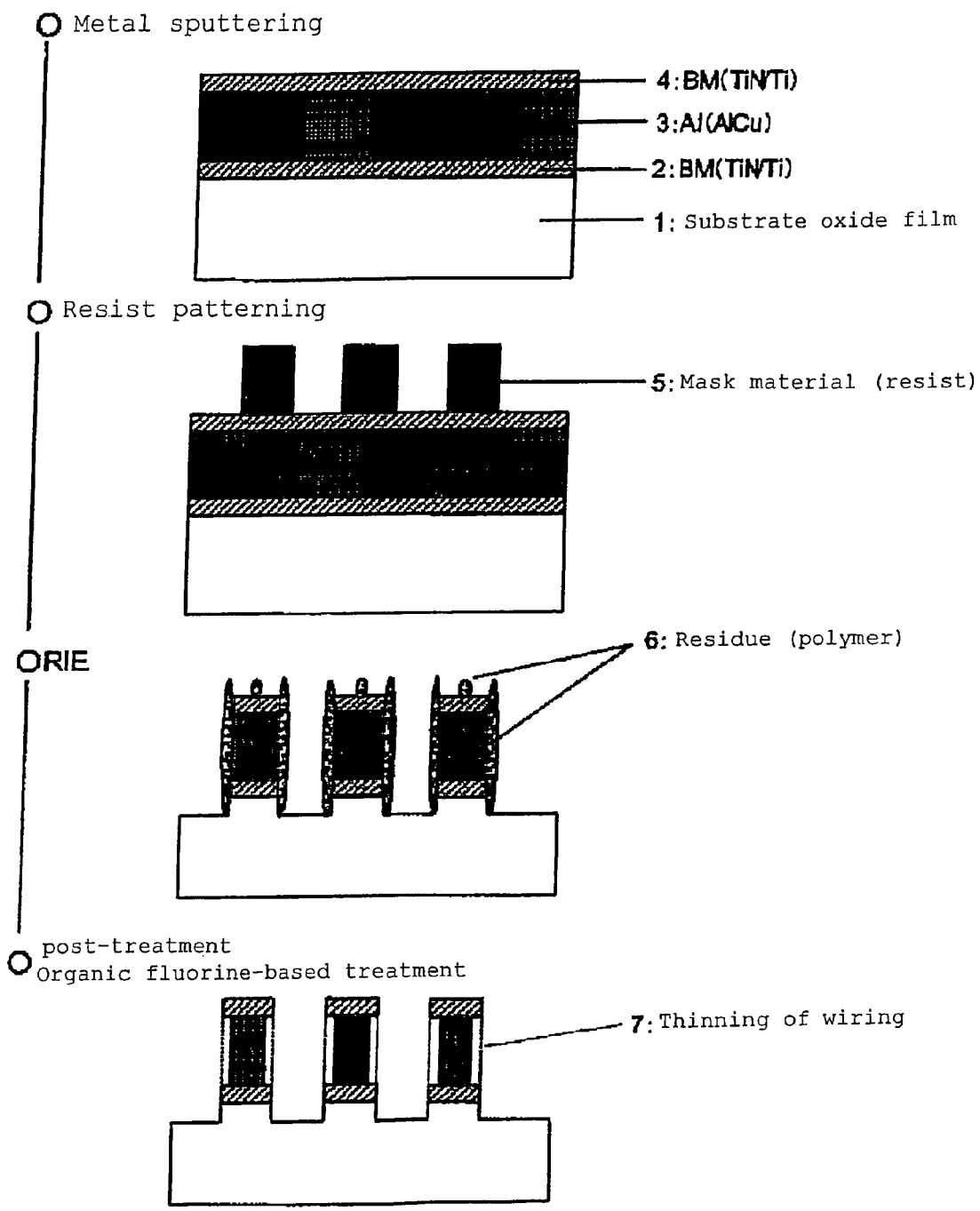
FIG. 1 is a diagram of a semiconductor circuit element (with a wiring material film) treated with an organic fluorine photoresist residue remover.

Examples of the inorganic acid used in the photoresist residue remover composition of the present invention include sulfuric acid, nitric acid, hydrochloric acid, and phosphoric acid. Among these, sulfuric acid is preferable.

The present inventors have found that, when the amount of inorganic acid added is increased, the photoresist residue removability is reduced, and corrosiveness to aluminum, copper, tungsten, and an alloy having any of these metals as a main component depends on the type of acid, whereas when the amount of inorganic acid added is decreased, the photoresist residue removability improves but corrosiveness to the metals increases.

That is, when the amount of inorganic acid added is too large, photoresist residue removal becomes a problem, and when the amount thereof added is too small, corrosiveness to the metals becomes a problem. Although the reason therefor is unclear, it is surmised that when the amount of inorganic acid added is too large, dissociation of the inorganic fluorine compound is suppressed, thereby reducing the photoresist residue removability. The amount of inorganic acid added is therefore appropriately determined by the photoresist residue removability and the corrosiveness to the metals while taking into consideration the amount of inorganic fluorine compound added, and it is preferably 30% by mass or less, and more preferably 3 to 15% by mass.

Furthermore, examples of the inorganic fluorine compound used in the photoresist residue remover composition of the present invention include hydrofluoric acid, ammonium fluoride, and ammonium hydrogen fluoride. Among these, hydrofluoric acid is preferable.

The present inventors have found that, when the amount of inorganic fluorine compound added is increased, the photoresist residue removability increases and at the same time the corrosiveness to the metals increases, and when the amount thereof added is decreased, the photoresist residue removability and the corrosiveness to the metals are decreased. That is, when the amount of inorganic fluorine compound added is too large, the corrosiveness to the metals is a problem, and when the amount thereof added is too small, the photoresist residue removability becomes a problem. The amount of inorganic fluorine compound added is therefore appropriately determined by the photoresist residue removability and the corrosiveness to the metals while taking into consideration the amount of inorganic acid added, and is preferably 0.001 to 0.015% by mass, and more preferably 0.005 to 0.011% by mass.

Furthermore, it is preferable for the photoresist residue remover composition of the present invention to contain no hydrogen peroxide. When hydrogen peroxide is added, corrosion of the metals is accelerated, and not only is it impossible to ensure sufficient margin in the treatment conditions, but also there is a possibility of the stability over time of the photoresist residue remover composition being degraded due to decomposition of hydrogen peroxide.

Moreover, the photoresist residue remover composition of the present invention may contain a surfactant in order to improve the removability of particles of an organometallic polymer, etc. contained in the photoresist residue, or in order to improve the ease of microfabrication by improving the wettability toward a substrate.

Furthermore, the photoresist residue remover composition of the present invention may further contain a complexing agent in order to improve the removability of a metal oxide, etc.

During the process of examining the problems of the present invention, the present inventors have gained the knowledge that, when the photoresist residue remover of the present invention contains 0.001 to 0.015% by mass of the inorganic fluorine compound, even when it contains 30% by mass or greater of sulfuric acid, although the removability of the photoresist residue is degraded, the corrosiveness to metals is suppressed. The composition of the present invention is therefore a novel composition that, by adjusting the amount of sulfuric acid added, can be used not only in a single wafer cleaning system, which requires a short, low temperature treatment, but also in a batchwise dipping system involving a long, high temperature treatment.

Figure 3:
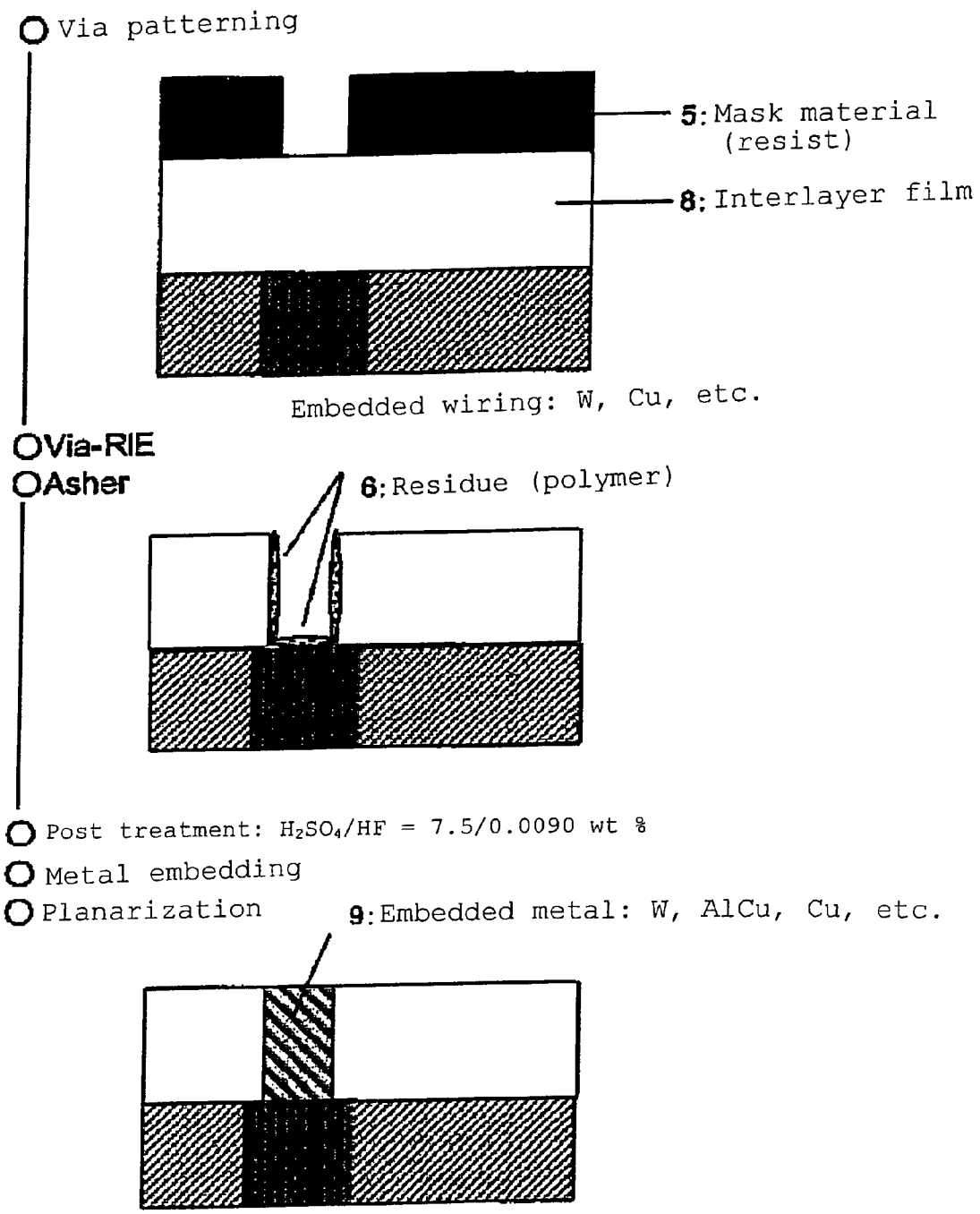
FIG. 3 is a diagram of a semiconductor circuit element (multilayer wiring having a damascene structure or a through hole) treated with the photoresist residue remover composition of the present invention.

Moreover, use of the photoresist residue remover composition of the present invention enables a pre-treatment or post-treatment to be carried out on multilayer wiring. The pre-treatment referred to here means a pre-treatment for a metal embedding step, that is, a step of removing a photoresist residue before metal embedding of multilayer wiring having a damascene structure or a through hole as shown in FIG. 3. By removing, with the photoresist residue remover composition of the present invention, residue present on the damascene or the through hole after dry etching and ashing, it is possible to prevent corrosion of the metal wiring of a lower layer or the embedded metal, etc.

Figure 2:
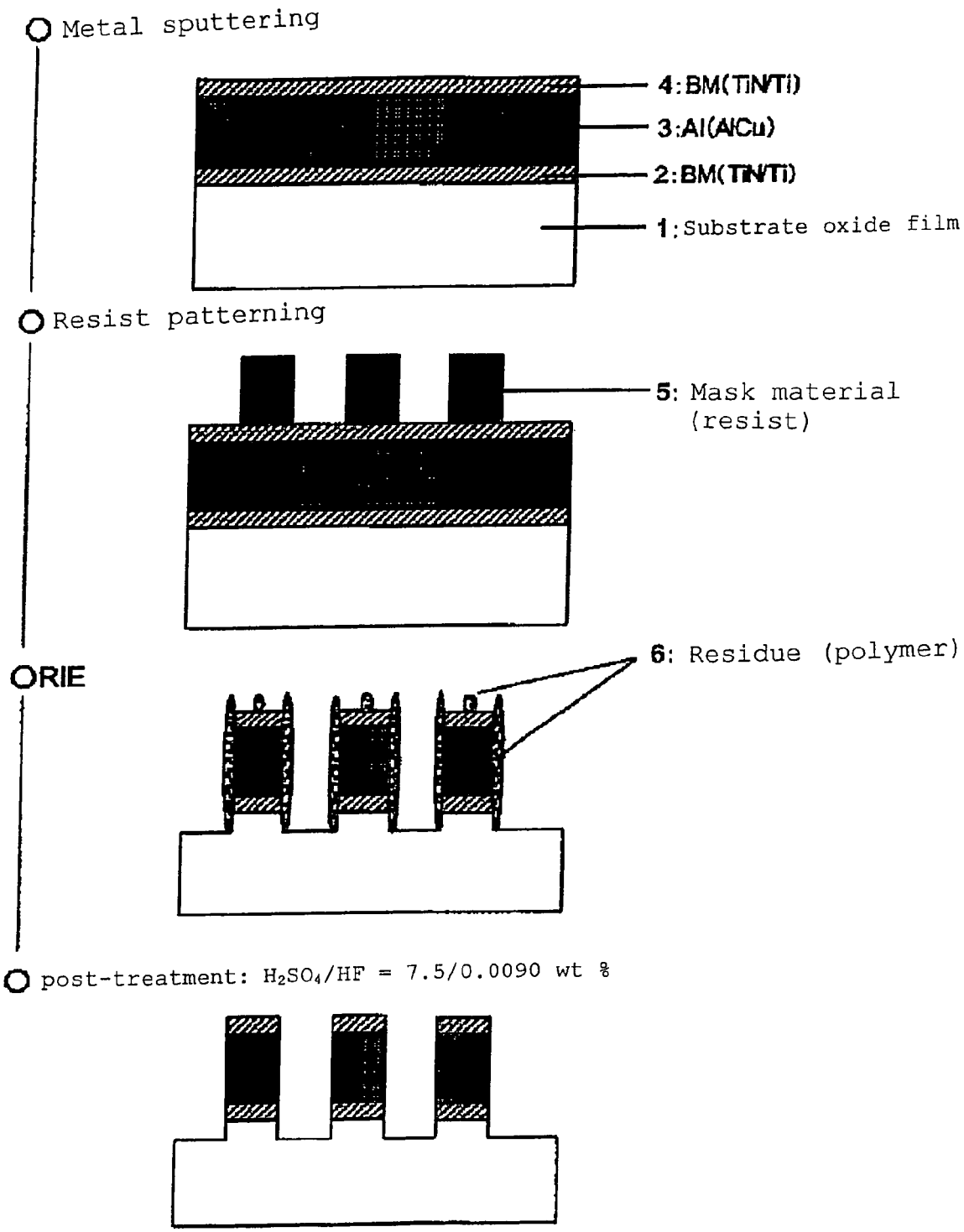
FIG. 2 is a diagram of a semiconductor circuit element (with a wiring material film) treated with the photoresist residue remover composition of the present invention.

The post-treatment referred to above means a treatment, with the remover of the present invention, of the resist residue and a residue such as a reaction product remaining on the wiring sidewall and the wiring after dry etching and ashing a wiring material film formed as shown in FIG. 2. The photoresist residue remover composition of the present invention not only has excellent removability but also has little influence on the metal, and can suppress thinning of the wiring and formation of voids.

The present invention is suitable for the pre-treatment and the post-treatment of multilayer wiring but can also be used as a remover for a photoresist residue formed during a dry etching—ashing treatment of a semiconductor circuit element with no metal wiring.

EXAMPLES

The photoresist residue remover composition of the present invention is now explained further in detail with reference to Examples and Comparative Examples, but the present invention is not limited by these Examples.

1) Corrosive Evaluation Test Against Al Wiring

As shown in FIG. 2, films of TiN/Ti, Al, and TiN/Ti were formed in sequence on a silicon wafer, dry etching was carried out using as a mask a resist that had been applied to the TiN/T, exposed, and developed, and after a wiring pattern was thus formed, the resist was removed by ashing to give a wafer on which a photoresist residue was formed. This wafer was subsequently subjected to a dipping treatment in a photoresist residue remover at 25° C. for 30 to 150 seconds and a rinsing treatment with running ultrapure water, dried, and then evaluated by electron microscopy with respect to removability of the photoresist residue and corrosiveness to Al. The results are given in Table 1.

2) Corrosive Evaluation Test Against Cu Wiring

Films of Cu damascene wiring using Ta as barrier metal, an interlayer insulating film, etc. were formed in sequence on a silicon wafer, dry etching was carried out using as a mask a resist that had been applied to the interlayer insulating film, exposed, and developed, and after a via hole was thus formed, the resist was removed by ashing to give a wafer on which a photoresist residue was formed. This wafer was subsequently subjected to a dipping treatment in a photoresist residue remover at 25° C. for 30 to 150 seconds and a rinsing treatment with running ultrapure water, dried, and then evaluated by electron microscopy with respect to removability of the photoresist residue and corrosiveness to Cu. The results are given in Table 2.

3) Evaluation Test of Amount of Cu or W Film Etched

A silicon wafer having a Cu or W film formed thereon was subjected to a dipping treatment in a photoresist residue remover at 25° C. for 60 minutes and a rinsing treatment with running ultrapure water, and dried, and the amount of Cu or W etched was then measured using an X-ray fluorescence film thickness meter. The results are given in Table 3.

4) Evaluation Test of Amount of Etching of AlCu Wiring in Rinsing Step after Removal of Resist As shown in FIG. 1 and FIG. 2, films of TiN/Ti, AlCu, and TiN/Ti were formed in sequence on a substrate oxide film, dry etching was carried out using as a mask a resist that had been applied to the TiN/Ti, exposed, and developed, and after a wiring pattern was thus formed, the resist was removed by ashing to give a wafer on which a photoresist residue was formed. This wafer was subsequently subjected to evaluation by the following method, which corresponds to the rinsing conditions, in terms of the corrosiveness to AlCu metal wiring during rinsing with pure water after removal of the photoresist residue.

Figure 4:
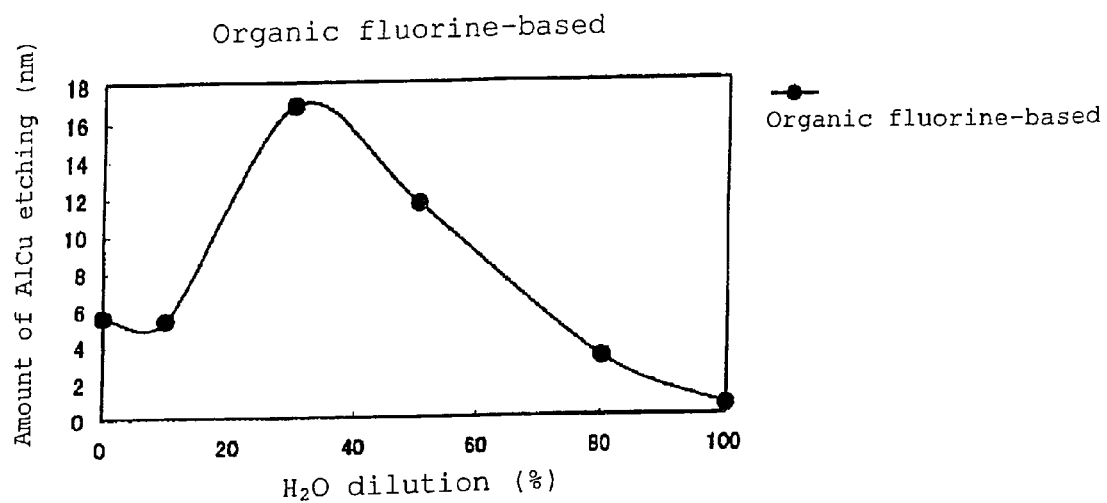
FIG. 4 is a diagram showing etching behavior of a semiconductor circuit element treated with an organic fluorine photoresist residue remover when rinsing with pure water.
Figure 5:
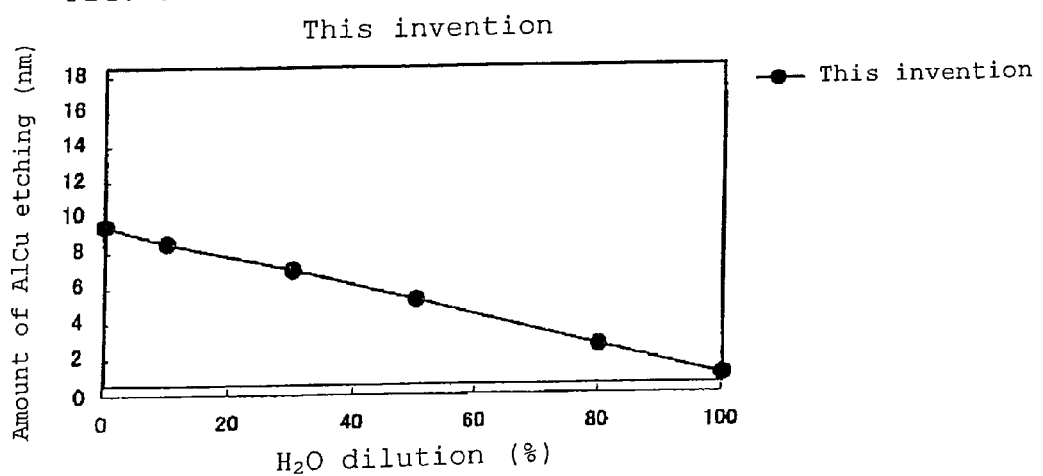
FIG. 5 is a diagram showing etching behavior of a semiconductor circuit element treated with the photoresist residue remover composition of the present invention when rinsing with pure water.

That is, the wafer was subjected to a dipping treatment at room temperature for 90 seconds in an aqueous solution containing 0.009% by mass of HF and 7.5% by mass of sulfuric acid, which is a composition of the present invention, and then a dipping treatment in the above composition diluted with pure water for 60 seconds, dried, and then subjected to a measurement, using a four-point probe system sheet resistance meter, of the amount of etching of AlCu metal wiring. The results are given in FIG. 5. The amount of etching when the treatment was carried out in the same manner using a conventionally used fluorine compound and organic solvent-containing photoresist residue remover (ELM-C30 manufactured by Mitsubishi Gas Chemical Company, Inc.) was also measured. The results are given in FIG. 4.

TABLE 1

| Composition No. | Component 1 | % by mass | Component 2 | % by mass | Component 3 | % by mass | Temperature (° C.) | Time (sec.) | Photoresist residue removability *1 | Corrosiveness to Al *2 |
|---|---|---|---|---|---|---|---|---|---|---|
| 1 (Comp. Ex.) | EKC-265 *3 | | | | | | 25 | 90 | C | A |
| 2 (Comp. Ex.) | ELM-C30 *4 | | | | | | 25 | 90 | C | A |
| 3 (Ref. Ex.) | $H_2SO_4$ | 7.50 | HF | 0.009 | $H_2O_2$ | 7.50 | 25 | 60 | A | C |
| 4 (Ref. Ex.) | $H_2SO_4$ | 7.50 | HF | 0.009 | $H_2O_2$ | 7.50 | 25 | 90 | A | C |
| 5 (Ref. Ex.) | $H_2SO_4$ | 95.00 | HF | 0.180 | — | — | 25 | 90 | C | B |
| 6 (Ref. Ex.) | $H_2SO_4$ | 96.00 | HF | 0.005 | — | — | 25 | 90 | C | A |
| 7 | $H_2SO_4$ | 3.75 | HF | 0.005 | — | — | 25 | 90 | A | A |
| 8 | $H_2SO_4$ | 3.75 | HF | 0.009 | — | — | 25 | 60 | A | A |
| 9 | $H_2SO_4$ | 3.75 | HF | 0.009 | — | — | 25 | 90 | A | A |
| 10 | $H_2SO_4$ | 3.75 | HF | 0.015 | — | — | 25 | 90 | A | A |
| 11 | $H_2SO_4$ | 7.50 | HF | 0.005 | — | — | 25 | 90 | A | A |
| 12 | $H_2SO_4$ | 7.50 | HF | 0.009 | — | — | 25 | 60 | A | A |
| 13 | $H_2SO_4$ | 7.50 | HF | 0.009 | — | — | 25 | 90 | A | A |
| 14 | $H_2SO_4$ | 7.50 | HF | 0.015 | — | — | 25 | 90 | A | A |
| 15 | $H_2SO_4$ | 15.00 | HF | 0.009 | — | — | 25 | 90 | A | A |
| 16 | $H_2SO_4$ | 15.00 | HF | 0.015 | — | — | 25 | 90 | A | A |
| 17 | $H_3PO_4$ | 7.50 | HF | 0.009 | — | — | 25 | 90 | A | A |
| 18 | $HNO_3$ | 7.50 | HF | 0.009 | — | — | 25 | 90 | A | A |
| 19 | HCl | 7.50 | HF | 0.009 | — | — | 25 | 90 | A | A |

*1 A: good, C: photoresist residue remaining
*2 A: no corrosion, B: slight corrosion, C: corroded
*3 An aminoalcohol-containing photoresist residue remover manufactured by EKC Technology.
*4 A fluorine compound and organic solvent-containing photoresist residue remover manufactured by Mitsubishi Gas Chemical Company, Inc.

TABLE 2

| Composition No. | Component 1 | % by mass | Component 2 | % by mass | Component 3 | % by mass | Temperature (° C.) | Time (sec.) | Photoresist residue removability *1 | Corrosiveness to Cu *2 |
|---|---|---|---|---|---|---|---|---|---|---|
| 20 (Comp. Ex.) | EKC-265 *3 | | | | | | 25 | 90 | C | A |
| 21 (Comp. Ex.) | ELM-C3C *4 | | | | | | 25 | 90 | C | A |
| 22 (Ref. Ex.) | $H_2SO_4$ | 7.50 | HF | 0.009 | $H_2O_2$ | 7.50 | 25 | 60 | A | B |
| 23 (Ref. Ex.) | $H_2SO_4$ | 7.50 | HF | 0.009 | $H_2O_2$ | 7.50 | 25 | 90 | A | B |
| 24 (Ref. Ex.) | $H_2SO_4$ | 95.00 | HF | 0.180 | — | — | 25 | 90 | C | B |
| 25 | $H_2SO_4$ | 7.50 | HF | 0.009 | — | — | 25 | 90 | A | A |
| 26 | $H_3PO_4$ | 7.50 | HF | 0.009 | — | — | 25 | 90 | A | A |
| 27 | $HNO_3$ | 7.50 | HP | 0.009 | — | — | 25 | 90 | A | A |
| 28 | HCl | 7.50 | HF | 0.009 | — | — | 25 | 90 | A | A |

*1 A: good, C: photoresist residue remaining
*2 A: no corrosion, B: slight corrosion, C: corroded
*3 An aminoalcohol-containing photoresist residue remover manufactured by EKC Technology.
*4 A fluorine compound and organic solvent-containing photoresist residue remover manufactured by Mitsubishi Gas Chemical Company, Inc.

TABLE 3

| Composition No. | Component 1 | % by mass | Component 2 | % by mass | Component 3 | % by mass | Temperature (° C.) | Time (sec.) | Amount of Cu etched (nm) | Amount of W etched (nm) |
|---|---|---|---|---|---|---|---|---|---|---|
| 29 | $H_2SO_4$ | 7.50 | HF | 0.009 | — | — | 25 | 60 | 5.9 | 1.0↓ |
| 30 | $H_3PO_4$ | 7.50 | HF | 0.009 | — | — | 25 | 60 | 4.2 | 1.0↓ |
| 31 | $HNO_3$ | 7.50 | HF | 0.009 | — | — | 25 | 60 | 7.0 | 1.0↓ |
| 32 | HCl | 7.50 | HF | 0.009 | — | — | 25 | 60 | 6.4 | 1.0↓ |

From the above-mentioned results, it has been confirmed that the photoresist remover compositions of the present invention have sufficient photoresist removability even in a short, low temperature treatment and are not corrosive to metals.

Furthermore, the photoresist remover compositions of the present invention cause far less etching during the rinsing step compared with an organic fluorine photoresist residue remover, and can suppress thinning and void formation in Al wiring.

In accordance with use of the photoresist residue remover composition of the present invention, which removes the photoresist residue formed during a resist ashing treatment after dry etching in the step of forming, on a substrate surface, wiring of any metal of aluminum, copper, tungsten, and an alloy having one of these metals as a main component, the photoresist residue can be removed by a short, low temperature treatment without corroding the metal wiring.

What is claimed is:

1. A process for producing a semiconductor circuit element wherein, in a step of forming wiring of any metal of aluminum, copper, tungsten, or an alloy having any of these metals as a main component, wherein a photoresist residue remover composition is used for removing a photoresist residue formed by a resist ashing treatment after dry etching and the composition consists of one or two or more types of inorganic acid, one or two or more types of inorganic fluorine compound and water, wherein the amount of inorganic acid added is 3 to 15% by mass, and the amount of inorganic fluorine compound added is 0.001 to 0.015% by mass on a hydrofluoric acid basis.

2. The process for producing a semiconductor circuit element according to claim 1, wherein the inorganic acid is selected from the group of sulfuric acid, nitric acid, hydrochloric acid and phosphoric acid.

3. The process for producing a semiconductor circuit element according to claim 1, wherein the inorganic fluorine compound is selected from the group of hydrofluoric acid, ammonium fluoride and ammonium hydrogen fluoride.

4. The process for producing a semiconductor circuit element according to claim 1, wherein the inorganic acid is sulfuric acid.

5. The process for producing a semiconductor circuit element according to claim 1, wherein the inorganic fluorine compound is hydrofluoric acid.

6. A process for producing a semiconductor circuit element wherein, in a step of forming wiring of any metal of aluminum, copper, tungsten, or an alloy having any of these metals as a main component, wherein a photoresist residue remover composition is used for removing a photoresist residue formed by a resist ashing treatment after dry etching and the composition consists of one or two or more types of inorganic acid, one or two or more types of inorganic fluorine compound, a completing agent and water, wherein the amount of inorganic acid added is 3 to 15% by mass, and the amount of inorganic fluorine compound added is 0.001 to 0.015% by mass on a hydrofluoric acid basis.

7. The process for producing a semiconductor circuit element according to claim 6, wherein the inorganic acid is selected from the group of sulfuric acid, nitric acid, hydrochloric acid and phosphoric acid.

8. The process for producing a semiconductor circuit element according to claim 6, wherein the inorganic fluorine compound is selected from the group of hydrofluoric acid, ammonium fluoride and ammonium hydrogen fluoride.

9. The process for producing a semiconductor circuit element according to claim 6, wherein the inorganic acid is sulfuric acid.

10. The process for producing a semiconductor circuit element according to claim 6, wherein the inorganic fluorine compound is hydrofluoric acid.

11. A process for producing a semiconductor circuit element wherein, in a step of forming multilayer wiring, wherein a photoresist residue remover composition is used for carrying out a pre-treatment or a post-treatment on multilayer wiring and the composition consists of one or two or more types of inorganic acid, one or two or more types of inorganic fluorine compound and water, wherein the amount of inorganic acid added is 3 to 15% by mass, and the amount of inorganic fluorine compound added is 0.001 to 0.015% by mass on a hydrofluoric acid basis.

12. The process for producing a semiconductor circuit element according to claim 11, wherein the inorganic acid is selected from the group of sulfuric acid, nitric acid, hydrochloric acid and phosphoric acid.

13. The process for producing a semiconductor circuit element according to claim 11, wherein the inorganic fluorine compound is selected from the group of hydrofluoric acid, ammonium fluoride and ammonium hydrogen fluoride.

14. The process for producing a semiconductor circuit element according to claim 11, wherein the inorganic acid is sulfuric acid.

15. The process for producing a semiconductor circuit element according to claim 11, wherein the inorganic fluorine compound is hydrofluoric acid.

16. A process for producing a semiconductor circuit element wherein, in a step of forming multilayer wiring, wherein a photoresist residue remover composition is used for carrying out a pre-treatment or a post-treatment on multilayer wiring and the composition consists of one or two or more types of inorganic acid, one or two or more types of inorganic fluorine compound, a completing agent and water, wherein the amount of inorganic acid added is 3 to 15% by mass, and the amount of inorganic fluorine compound added is 0.001 to 0.015% by mass on a hydrofluoric acid basis.

17. The process for producing a semiconductor circuit element according to claim 16, wherein the inorganic acid is selected from the group of sulfuric acid, nitric acid, hydrochloric acid and phosphoric acid.

18. The process for producing a semiconductor circuit element according to claim 16, wherein the inorganic fluorine compound is selected from the group of hydrofluoric acid, ammonium fluoride and ammonium hydrogen fluoride.

19. The process for producing a semiconductor circuit element according to claim 16, wherein the inorganic acid is sulfuric acid.

20. The process for producing a semiconductor circuit element according to claim 16, wherein the inorganic fluorine compound is hydrofluoric acid.

* * * * *